(12) United States Patent
Huang et al.

(10) Patent No.: US 9,451,713 B2
(45) Date of Patent: Sep. 20, 2016

(54) DATA CARD AND DATA INTERACTION SYSTEM

(71) Applicant: ZTE Corporation, Shenzhen, Guangdong (CN)

(72) Inventors: Pan Huang, Shenzhen (CN); Lu Zhang, Shenzhen (CN); Wei Li, Shenzhen (CN); Qingmin Gao, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 0 days.

(21) Appl. No.: 14/428,507

(22) PCT Filed: Jun. 25, 2013

(86) PCT No.: PCT/CN2013/077934
§ 371 (c)(1),
(2) Date: Mar. 16, 2015

(87) PCT Pub. No.: WO2013/170807
PCT Pub. Date: Nov. 21, 2013

(65) Prior Publication Data
US 2015/0237745 A1  Aug. 20, 2015

(30) Foreign Application Priority Data
Sep. 27, 2012 (CN) .......................... 2012 1 0374477

(51) Int. Cl.
| | |
|---|---|
| *H05K 7/00* | (2006.01) |
| *H05K 5/00* | (2006.01) |
| *H05K 5/02* | (2006.01) |
| *H05K 1/02* | (2006.01) |

(52) U.S. Cl.
CPC ............. *H05K 5/0073* (2013.01); *H05K 1/02* (2013.01); *H05K 5/0226* (2013.01); *H05K 2201/10098* (2013.01)

(58) Field of Classification Search
CPC .................................................. G06K 7/10316
USPC ....................................... 361/679.01–679.05
See application file for complete search history.

(56) References Cited

U.S. PATENT DOCUMENTS

2007/0105418 A1* 5/2007 Fu .......................... H01R 13/665
439/136
2009/0325414 A1* 12/2009 Peng .................. G06K 7/10316
439/327

(Continued)

FOREIGN PATENT DOCUMENTS

CN      201197148 Y     2/2009
CN      101707278 A     5/2010

(Continued)

OTHER PUBLICATIONS

Supplementary European Search Report in European application No. 13790889.3, mailed on Aug. 5, 2015.

(Continued)

*Primary Examiner* — Jerry Wu
(74) *Attorney, Agent, or Firm* — Oppedalh Patent Law Firm LLC

(57) ABSTRACT

Disclosed is a data card, comprising a casing, a PCB and a main antenna arranged in the internal cavity of the casing, and an adapter fixedly connected to the casing. The data card also comprises a metal rotating shaft for an adapter which is arranged in the casing and electrically connected to the adapter. The metal rotating shaft for an adapter and the adapter form a diversity an antenna of the data card. Also disclosed is a data interaction system comprising a data card and a user terminal. By means of the solution disclosed in the present invention, since a diversity antenna need not be independently arranged, the overall dimensions of a data card are reduced, and the appearance of the data card is ensured, thereby reducing the production cost of the data card.

11 Claims, 2 Drawing Sheets

(56) References Cited

U.S. PATENT DOCUMENTS

| | | | |
|---|---|---|---|
| 2012/0119956 A1* | 5/2012 | Chen | H01Q 1/243 343/702 |
| 2013/0050049 A1 | 2/2013 | Liu | |
| 2013/0314296 A1 | 11/2013 | Xu et al. | |
| 2015/0072539 A1 | 3/2015 | Xie | |

FOREIGN PATENT DOCUMENTS

| | | |
|---|---|---|
| CN | 101847214 A | 9/2010 |
| CN | 101867385 A | 10/2010 |
| CN | 102158246 A | 8/2011 |
| CN | 102176344 A | 9/2011 |
| CN | 102930328 A | 2/2012 |
| CN | 102646907 A | 8/2012 |
| EP | 2660986 A1 | 11/2013 |

OTHER PUBLICATIONS

International Search Report in international application No. PCT/CN2013/077934, mailed on Oct. 10, 2013.

English Translation of the Written Opinion of the International Search Authority in international application No. PCT/CN2013/077934, mailed on Oct. 10, 2013.

* cited by examiner

DATA CARD AND DATA INTERACTION SYSTEM

TECHNICAL FIELD

The invention relates to a technical field of wireless communication, and particularly relates to a data card and a data interaction system.

BACKGROUND

In recent years, with the rapid development of wireless communication technologies, personal data cards have been popularized and widely used. Such a data cards in use is always connected to a user terminal (e.g., a notebook or a netbook) through a data adapter (USB plug), and then a network connection is carried out. However, as material of the user terminal is generally metallic, when the data card is close to such material, antennas of the data card may be affected by metallic parts, thereby resulting in a decrease of radiation efficiency of the antenna and a distortion of a radiation pattern of the antenna, and finally affecting users' use.

In order to improve network speed of wireless terminal products used by the users, at present, antenna diversity techniques are generally adopted. In this case, two antennas, which are respectively a main antenna and a diversity antenna, are arranged in one data card. Utilizing the diversity antenna has a benefit that the download speed of the data card can be improved. However, as a certain space is required to arrange the diversity antenna, the size of the current data card is generally large. Therefore, the cost of the data card is increased while the appearance is not attractive.

SUMMARY

An object of the invention is to provide a data card and a data interaction system, so as to reduce the size of the data card, thereby reducing production cost of the data card while ensuring an attractive appearance of the data card.

An embodiment of the invention provides a data card, including a casing, an adapter fixedly connected to the casing, as well as a printed circuit board (PCB) and a main antenna both arranged in an internal cavity of the casing. The data card further includes a metal rotating shaft for the adapter, which is arranged in the casing and electrically connected to the adapter. The metal rotating shaft for the adapter and the adapter form a diversity antenna of the data card.

An embodiment of the invention further provides a data interaction system including a data card and a user terminal connected to the data card. The data card includes a casing, an adapter connected to the casing, as well as a PCB and a main antenna both arranged in an internal cavity of the casing. The data card further includes a metal rotating shaft for the adapter, which is arranged in the casing and electrically connected to the adapter. The metal rotating shaft for the adapter and the adapter form a diversity antenna of the data card.

According to the embodiments of the invention, the PCB and the main antenna are arranged in the internal cavity of the casing of the data card, while the metal rotating shaft for the adapter electrically connected to the adapter is also arranged in the internal cavity of the casing; the diversity antenna of the data card is formed by the electrical connection between the metal rotating shaft for the adapter and the adapter, and an antenna of the data card can be formed together by the diversity antenna and the main antenna. Hence, as a diversity antenna needs not to be independently arranged, external dimensions of the data card are reduced, and an attractive appearance of the data card is ensured, thereby the production cost of the data card is reduced.

BRIEF DESCRIPTION OF THE DRAWINGS

FIG. 3 is a structural representation of a first example of a second embodiment of the data card according to the invention;

FIG. 4 is a structural representation of a second example of the second embodiment of the data card according to the invention.

DETAILED DESCRIPTION

It should be appreciated that, the detailed embodiments described herein are merely intended to illustrate the invention, rather than limiting the invention.

An embodiment of the invention provides a data card, in which a diversity antenna of the data card is formed by electrically connecting an adapter to a metal rotating shaft for the adapter, and the diversity antenna and a main antenna of the data card together form an antenna of the data card, so as to achieve data interaction with a user terminal.

Figure 1:
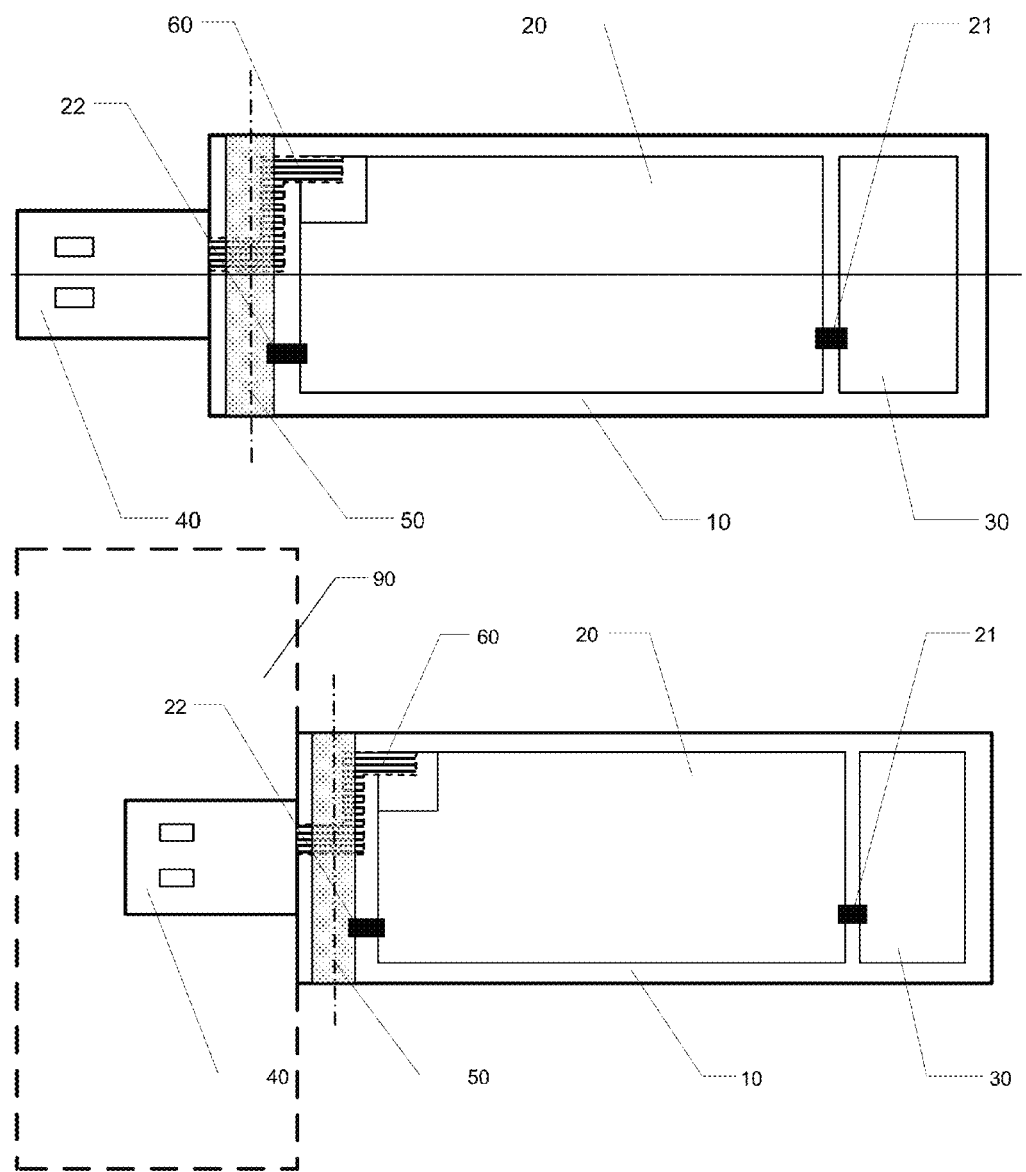
FIG. 1 is a structural representation of a first example of a first embodiment of the data card according to the invention.
Figure 2:
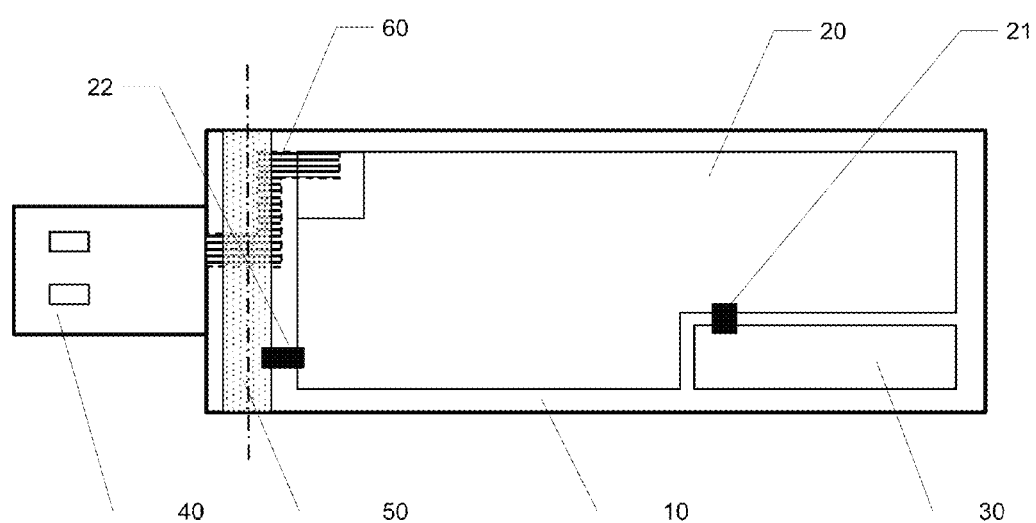
FIG. 2 is a structural representation of a second example of the first embodiment of the data card according to the invention.

Referring to FIGS. 1 and 2, FIG. 1 is a structural representation of a first example of a first embodiment of the data card according to the invention; and FIG. 2 is a structural representation of a second example of the first embodiment of the data card according to the invention.

The data card according to the embodiment includes a casing 10, a printed circuit board (PCB) 20 and a main antenna 30 both arranged in an internal cavity of the casing 10, as well as a adapter 40 which is fixedly connected to the casing 10 and configured to be plugged in a user terminal, such as a computer, so as to achieve data interaction. In the embodiment, the data card further includes a metal rotating shaft 50 for the adapter which is arranged in the casing 10 and electrically connected to the adapter 40. A diversity antenna of the data card is formed when the metal rotating shaft 50 for the adapter is electrically connected to the adapter 40, and an antenna of the data card is formed together by the diversity antenna and the main antenna 30, such that the download speed of the data card is improved.

According to the embodiment of the invention, the PCB 20 and the main antenna 30 are arranged in the internal cavity of the casing 10 of the data card, while the metal rotating shaft 50 for the adapter electrically connected to the adapter 40 is also arranged in the internal cavity of the casing 10; and the metal rotating shaft 50 for the adapter is electrically connected to the adapter 40 so as to form the diversity antenna of the data card, which, together with the main antenna 30, form an antenna of the data card. Hence, since it is unnecessary to provide a diversity antenna independently, external dimensions of the data card are reduced, and an attractive appearance of the data card is ensured, and thus the production cost of the data card is reduced.

In the above embodiment, the PCB 20 is provided with a first feeding part 21 and a second feeding part 22. The first feeding part 21 is connected to the main antenna 30 and configured to feed to the main antenna 30, and the second feeding part 22 is connected to the metal rotating shaft 50 for the adapter and configured to feed to the metal rotating shaft 50 for the adapter. The first feeding part 21 feeds to the main antenna 30; and due to the electrical connection between the metal rotating shaft 50 for the adapter and the adapter 40, the second feeding part 22 feeds to the metal rotating shaft 50 for the adapter. Therefore, due to the metal rotating shaft 50 for the adapter and the adapter 40 which are electrically connected, as well as the main antenna 30, two antennas of the data card are formed, and operate simultaneously.

By arranging the first feeding part 21 to be connected to the main antenna 30 and feed to the main antenna 30, arranging the second feeding part 22 to be connected to the metal rotating shaft 50 for the adapter and feed to the metal rotating shaft 50 for the adapter, and arranging the metal rotating shaft 50 for the adapter to be electrically connected to the adapter 40, two antennas of the data card are formed by the electrical connection between the metal rotating shaft 50 for the adapter and the adapter 40, as well as the main antenna 30, and the two antennas operate simultaneously, thereby providing a strong guarantee for improving the download speed of the data card.

In the above embodiment, the data card further includes an adapter connecting wire 60, either end of which is connected to the PCB 20 and the adapter 40. One end of the adapter connecting wire 60 connected to the PCB 20 is in electrical connection with the PCB 20, and by power supply from the PCB 20, the adapter 40 is connected to the PCB 20.

Referring to FIGS. 3 and 4, FIG. 3 is a structural representation of a first example of a second embodiment of the data card according to the invention; and FIG. 4 is a structural representation of a second example of the second embodiment of the data card according to the invention.

In addition to the data card according to the first embodiment of the invention, the data card according to the second embodiment further includes a metal structural member 70 arranged in the internal cavity of the casing 10. The metal structural member 70 is electrically connected to the metal rotating shaft 50 for the adapter, and electrically connected to the adapter 40 through the metal rotating shaft 50 for the adapter.

In the embodiment, the PCB 20 is further provided with a third feeding part 23 which is connected to the metal structural member 70 and configured to feed to the metal structural member 70. The metal structural member 70 is electrically connected to the PCB 20 through the third feeding part 23. Due to the electrical connection between the metal structural member 70 and the metal rotating shaft 50 for the adapter, the electrical connection between the metal rotating shaft 50 for the adapter and the adapter 40 is achieved. Therefore, the diversity antenna of the data card is also formed by means of the electrical connection between the metal rotating shaft 50 for the adapter and the adapter 40, and the antenna of the data card is formed together by the diversity antenna and the main antenna 30, so as to improve the download speed of the data card.

An embodiment of the invention further provides a data interaction system.

The data interaction system provided by the embodiment includes a data card and a user terminal 90 (shown in FIG. 1) connected to the data card. The data card includes a casing 10, a PCB 20 and a main antenna 30 both arranged in an internal cavity of the casing 10, as well as a adapter 40 fixedly connected to the casing 10 and configured to be plugged in the user terminal 90, such as a computer, so as to achieve data interaction. In the embodiment, the data card further includes a metal rotating shaft 50 for the adapter which is arranged in the casing 10 and electrically connected to the adapter 40. When the metal rotating shaft 50 for the adapter is electrically connected to the adapter 40, a diversity antenna of the data card is formed and an antenna of the data card is formed by the diversity antenna together with the main antenna 30, so as to improve the download speed of the data card.

In the embodiment, the connection between the metal rotating shaft 50 for the adapter and the adapter 40 of the data card is an electrical connection, and the adapter 40, after being plugged in the user terminal 90 and electrically contacting a metal body in the user terminal 90, also establishes an electrical connection. Therefore, the electrical connections among the metal rotating shaft 50 for the adapter, the adapter 40 of the data card and the metal body in the user terminal 90 together form a radiator of the antenna in the data card, such that the purpose of radiation to achieved.

According to the embodiments of the invention, by arranging the metal rotating shaft 50 for the adapter electrically connected to the adapter 40 in the internal cavity of the casing 10, the diversity antenna of the data card is formed by means of the electrical connection between the metal rotating shaft 50 for the adapter and the adapter 40. Moreover, after the adapter 40 is plugged in the user terminal, the electrical connections among the metal rotating shaft 50 for the adapter, the adapter 40 and the metal body in the user terminal together form a radiator of the antenna in the data card, such that the impact of the metal body in the user terminal on the radiation performance of the data card is avoided, the radiation capacity of the data card is greater, and then the wireless performance of the data card is effectively improved.

The above description is the preferred embodiments of the invention, and not intended to limit the patent scope of the disclosure. Any modifications of equivalent structure or equivalent process made on the basis of the contents of the description and accompanying drawings of the disclosure, or direct or indirect applications in other related technical fields, should also all fall within the scope of patent protection of the disclosure.

The invention claimed is:

1. A data card, comprising a casing, an adapter, comprising a conductive housing, fixedly connected to the casing, wherein the housing is configured to insert into a user terminal, as well as a printed circuit board and a main antenna both arranged in an internal cavity of the casing, wherein the data card further comprises a metal rotating shaft for the adapter, which is arranged in the casing and electrically connected to the adapter, and the metal rotating shaft for the adapter and the conductive housing form a diversity antenna of the data card.

2. The data card according to claim 1, wherein the printed circuit board is provided with a first feeding part which is connected to the main antenna and configured to feed to the main antenna, and a second feeding part which is connected to the metal rotating shaft for the adapter and configured to feed to the metal rotating shaft for the adapter.

3. The data card according to claim 2, wherein the data card further comprises an adapter connecting wire, which connects the printed circuit board and the adapter, and one end of which is electrically connected to the printed circuit board.

4. The data card according to claim 1, wherein the data card further comprises a metal structural member, which is arranged in the internal cavity of the casing and electrically connected to the adapter through the metal rotating shaft for the adapter.

5. The data card according to claim 4, wherein the printed circuit board is further provided with a third feeding part which is connected to the metal structural member and configured to feed to the metal structural member.

6. A data interaction system, comprising a data card and a user terminal with a metal body connected to the data card, wherein the data card comprises a casing, an adapter connected to the casing, as well as a printed circuit board and a main antenna both arranged in an internal cavity of the casing, the data card further comprises a metal rotating shaft for the adapter, which is arranged in the casing and electrically connected to the adapter, and the metal rotating shaft for the adapter, the metal body, and the adapter form a diversity antenna of the data card.

7. The data interaction system according to claim 6, wherein the metal rotating shaft for the adapter is electrically connected to the adapter, and when the adapter is plugged in the user terminal, the adapter is electrically connected to the metal body in the user terminal, and thus the metal rotating shaft for the adapter, the adapter and the metal body in the user terminal together form a radiator of the antenna in the data card.

8. The data interaction system according to claim 6, wherein the printed circuit board is provided with a first feeding part which is connected to the main antenna and configured to feed to the main antenna, and a second feeding part which is connected to the metal rotating shaft for the adapter and configured to feed to the metal rotating shaft for the adapter.

9. The data interaction system according to claim 8, wherein the data card further comprises an adapter connecting wire, which connects the printed circuit board and the adapter, and one end of which is electrically connected to the printed circuit board.

10. The data interaction system according to claim 6, wherein the data card further comprises a metal structural member, which is arranged in the internal cavity of the casing and electrically connected to the adapter through the metal rotating shaft for the adapter.

11. The data interaction system according to claim 10, wherein the printed circuit board is further provided with a third feeding part which is connected to the metal structural member and configured to feed to the metal structural member.

* * * * *